United States Patent [19]
Reddy

[11] Patent Number: 5,432,467
[45] Date of Patent: Jul. 11, 1995

[54] PROGRAMMABLE LOGIC DEVICE WITH LOW POWER VOLTAGE LEVEL TRANSLATOR

[75] Inventor: Srinivas T. Reddy, Santa Clara, Calif.

[73] Assignee: Altera Corporation, San Jose, Calif.

[21] Appl. No.: 324,312

[22] Filed: Oct. 17, 1994

Related U.S. Application Data

[63] Continuation of Ser. No. 58,593, May 7, 1993, abandoned.

[51] Int. Cl.⁶ ............. H03K 19/0185; H03K 19/0948
[52] U.S. Cl. ............................ 326/81; 326/37; 326/68; 327/203
[58] Field of Search ............... 307/451, 475, 443, 264, 307/465, 272.2; 326/37, 39–40, 45, 68, 81, 83, 121; 327/203, 306

[56] References Cited

U.S. PATENT DOCUMENTS

| | | | |
|---|---|---|---|
| 4,617,479 | 10/1986 | Hartmann et al. | 307/465 |
| 4,642,487 | 2/1987 | Carter | 307/465 |
| 4,675,557 | 6/1987 | Huntington . | |
| 4,689,503 | 8/1987 | Suzuki et al. | 307/443 |
| 4,706,216 | 11/1987 | Carter | 365/94 |
| 4,831,573 | 5/1989 | Norman | 364/716 |
| 4,914,318 | 4/1990 | Allen | 307/451 |
| 5,012,136 | 4/1991 | Dixon et al. | 307/775 |
| 5,034,634 | 7/1991 | Yamamoto | 307/465 |
| 5,136,190 | 8/1992 | Chern et al. | 307/475 |
| 5,144,157 | 9/1992 | Russell et al. | 307/270 |
| 5,179,299 | 1/1993 | Tipon | 307/465 |
| 5,182,475 | 1/1993 | Lien | 307/475 |
| 5,204,557 | 4/1993 | Nguyen | 307/451 |
| 5,223,751 | 6/1993 | Simmons et al. | 326/81 |
| 5,225,718 | 7/1993 | Seshita et al. | 307/465 |

FOREIGN PATENT DOCUMENTS

| | | | |
|---|---|---|---|
| 2248988 | 4/1992 | United Kingdom | 307/475 |

*Primary Examiner*—Edward P. Westin
*Assistant Examiner*—Jon Santamauro
*Attorney, Agent, or Firm*—Townsend and Townsend Khourie and Crew

[57] ABSTRACT

A voltage translation circuit 6 and method of operating a circuit to provide voltage level translation, particularly for use in association with a programmable logic device 2. An input signal, is provided to an NMOS transistor N2 and a CMOS inverter 12. The inverter 12 drives an NMOS pulldown transistor N4. The drain of N2 is coupled to the input of an inverter 14, the output of which is also coupled to the translation circuit output. A source of PMOS pullup transistor P1 drives the input of inverter 14 to pullup the output to a high level.

4 Claims, 3 Drawing Sheets

PROGRAMMABLE LOGIC DEVICE WITH LOW POWER VOLTAGE LEVEL TRANSLATOR

This is a continuation of application Ser. No. 08/058,593, filed May 7, 1993, now abandoned

BACKGROUND OF THE INVENTION

The present invention relates to the field of integrated circuits and methods of operation thereof. More specifically, in one embodiment the invention provides an improved method and device for translating voltage levels in an integrated circuit that has very low power consumption, particularly for use in a programmable logic device.

It is well known to those of skill in the art of integrated circuit design that voltage level translation is sometimes necessary. Common voltage level translation problems arise at the interface of TTL and ECL circuits, at the interface of ECL and CMOS circuits, and in TTL to CMOS translation. Additional problems arise as the electronics industry makes a transition from integrated circuits and systems using one voltage level power supply to another voltage level. Many common electronic components today operate with a 5 v supply voltage. However, as feature sizes are reduced in integrated circuits it has become necessary to utilize lower voltage supplies. Accordingly, many electronic components today utilize a supply voltage of less than 4 v, such as a 3.3 v supply voltage.

In some instances it is desirable to design systems in which different portions of the system operate at different voltages. For example, in the case of programmable logic devices (PLDs, otherwise known as PALs, PLAs, FPLAs, PLDs, EPLDs, EEPLDs, LCAs, and FPGAs) it is sometimes desirable to utilize 5 v within at least a part of a programmable logic device, but have the device output voltages between 0 and 3.3 v such that the logic device is compatible with lower voltage systems. Such devices may, for example, operate with a 5 v supply from an external source, or from a supply generated internally from a 3.3 v source.

A variety of solutions have been proposed for voltage level translation problems. Voltage level translation circuits are discussed in, for example, U.S. Pat. No. 5,136,190 (Chern et al.). According to Chern et al., a CMOS voltage level translator is utilized that converts from 3.6 v to 6 v. According to Chern et al., the input is buffered through two CMOS inverters. The outputs of these inverters are provided to a complex CMOS circuit including two PMOS pullup transistors, and two NMOS pulldown transistors. While Chern et al. propose that the circuit therein provides slightly improved switching speed and slightly lower switching current, the circuit is complex and minor process variations can impact the circuit performance significantly.

While meeting with substantial success, prior circuits have also met with certain limitations. For example, prior circuits often used more power than would be desirable, include more devices than would be desirable, or are slower than would be desirable.

From the above it is seen that an improved voltage level translator for integrated circuits and improved methods of operating integrated circuits with voltage level translation are needed, particularly in the area of programmable logic devices.

SUMMARY OF THE INVENTION

An improved voltage translator and method of operating an integrated circuit to provide voltage translation are provided by virtue of the present invention, particularly for use in a programmable logic device.

According to one aspect of the invention a pair of CMOS inverters are utilized. The pullup of one of the inverters is coupled to a first voltage level, and the pullup of the other inverter is coupled to a second voltage level, where the first voltage level is the high level of the input, and the second level is the desired high level of the output. The input of the translation circuit is provided to the gate of a first n-channel pulldown transistor and an input to the first CMOS inverter. The output of the first CMOS inverter is provided to a second n-channel pulldown transistor, the drain of which is coupled to the output of the circuit and the source of which is coupled to ground.

The input of the second CMOS inverter is coupled to the drain of the first pulldown transistor and the drain of a p-channel pullup transistor, the source of which is coupled to the second voltage level. The gate of the p-channel pullup is coupled to the output of the circuit, as is the output of the second CMOS inverter.

The circuit is not complex, yet it provides reliable voltage translation with a minimum power requirement. In particular, in a programmable logic device, for example, the circuit avoids DC power draw, drawing only AC switching power. At the same time, the circuit has a minimal speed impact on a device, and uses a small number of devices for minimum die size.

A further understanding of the nature and advantages of the inventions herein may be realized by reference to the remaining portions of the specification and the attached drawings.

DESCRIPTION OF THE PREFERRED EMBODIMENTS

Figure 1:
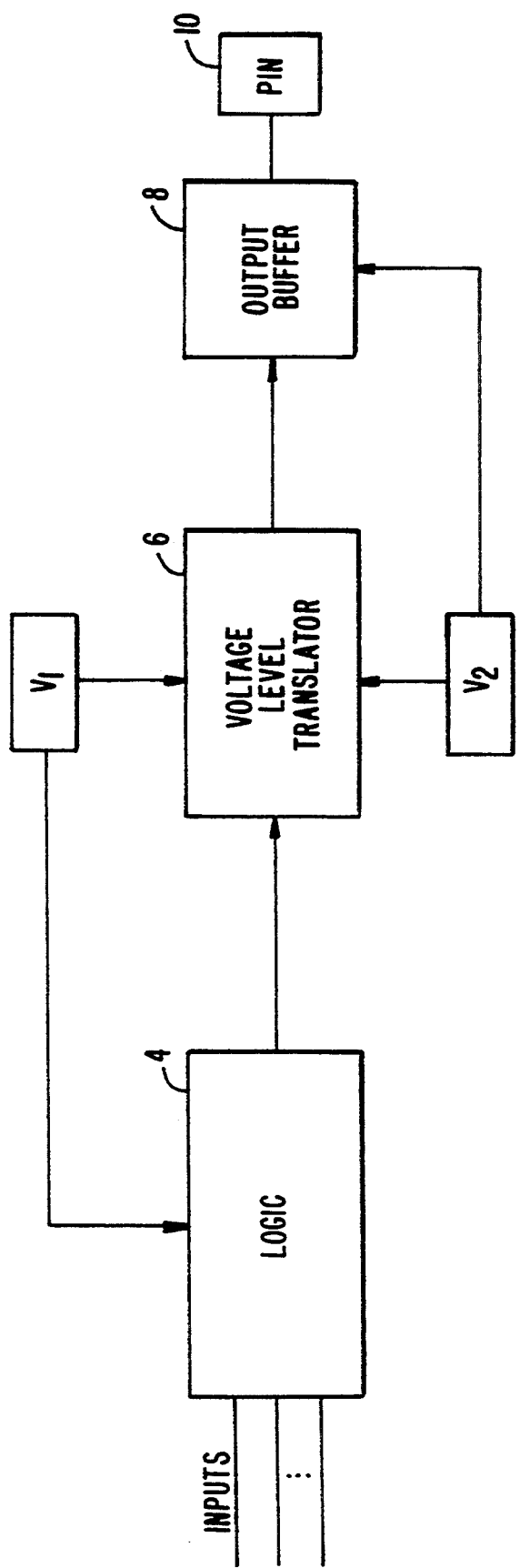
FIG. 1 illustrates a programmable logic device according to one aspect of the invention.

FIG. 1 illustrates a reprogrammable logic device 2 according to one aspect of the invention. Exemplary programmable logic devices that may utilize the invention herein are described in greater detail in, for example, U.S. Pat. Nos. 4,617,479 (Hartmann et al.), 4,831,573 (Norman), 4,706,216 (Carter), and 4,642,487 (Carter), all incorporated herein by reference for all purposes. The device includes logic circuit 4. Logic circuit 4 receives a number of inputs and outputs a combinatorial function of the inputs. While a single output is shown, it should be recognized that multiple outputs will be provided in many embodiments. The outputs may be direct combinational functions of the inputs, or the logic may provide sequential logic functions, or both.

According to one embodiment of the invention the programmable logic 4 utilizes a power supply V1, which may be provided from an external source via a pin, or the power supply may be generated internally on the logic device. As an example, the power supply V1 may be a 5 v power supply. The outputs of the logic circuit will be one of two voltage levels, normally 0 or V1.

The output(s) of the logic circuit is provided as input to a voltage level translator 6. Voltage level translator converts the output of the logic circuit 2 to different voltage levels. Voltage level translator is provided with a power supply voltage of V2, which will be different that V1. Optionally, voltage level translator 6 will also be provided with voltage level V1 as an input. In one embodiment of the invention the outputs of the logic circuit 4 will take on levels of 0 or V1, and the voltage level translator converts these to levels of 0 or V2. According to one preferred embodiment of the invention, V2 is lower than V1, such as less than 4 v, and preferably about 3.3 v.

The output of the voltage level translator is provided as input to an output buffer circuit 8. One function of output buffer circuit 8 is to provide isolation of the programmable logic device from external capacitances coupled to input/output pin 10. Output buffer 10 may provide additional functionality. For example, output buffer 10 may provide selective feedback of the output values as inputs to the logic circuit, selectively allow output pin 10 to act as an input pin, select among various signals for output to the pin, and other functions. In a preferred embodiment of the invention, output buffer circuit 8 is also provided with a power supply of V2.

Figure 2:
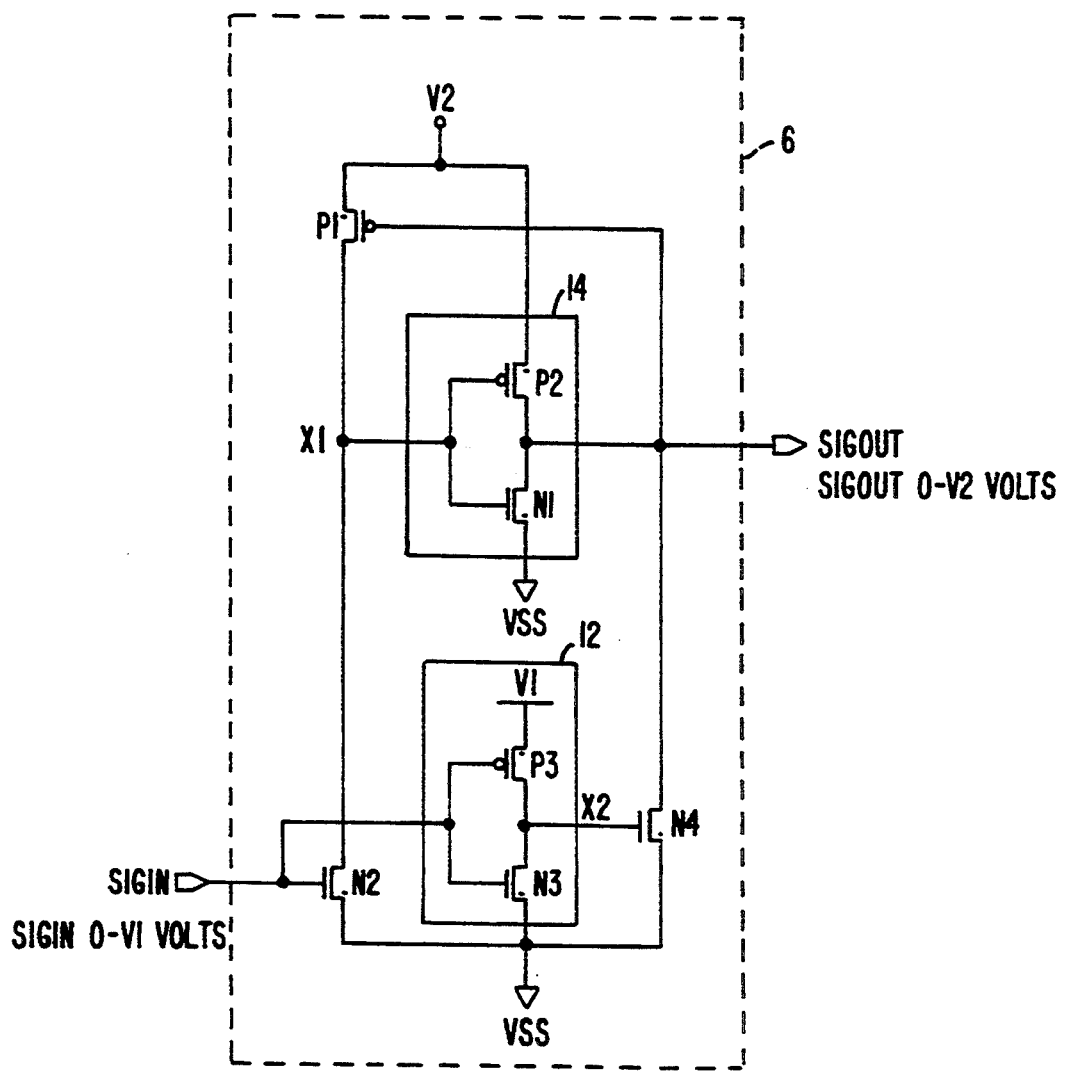
FIG. 2 illustrates a voltage level translator according to one embodiment of the invention.

A voltage level translation circuit is illustrated in greater detail in FIG. 2. The circuit inputs a signal SIGIN that varies from between about 0 volts and $V_1$ volts and outputs a signal SIGOUT that tracks the voltage of SIGIN (or its inverse if an inverter is added), except that it varies between about 0 volts and $V_2$ volts. The input is provided to the gate of NMOS transistor N2, as well as to the input of CMOS inverter 12. NMOS transistor N2 has a source terminal coupled to ground, and a drain terminal coupled to node X1. The drain of CMOS transistor P1 is also coupled to X1. Node X1 is, in turn, coupled to the input of CMOS inverter 14. CMOS inverters 12 and 14 each have sources of their NMOS pulldown transistors, N3 and N1 respectively, coupled to ground. The sources of pullups P3 and P2 are coupled to voltage sources V1 and V2, respectively. In alternative embodiments P3 may also have its source coupled to V2.

The output X2 of CMOS inverter 12 is coupled to the gate of NMOS pulldown transistor N4. The output of CMOS inverter 14 is coupled to SIGOUT, as is the drain of pulldown N4. SIGOUT is also coupled to the gate of PMOS transistor P1. The source of P1 is coupled to V2, along with the source of P2 . . . P1 makes sure that node X1 will not "float" to on indeterminant value when SIGIN is low. If X1 were to "float," both P2 and N1 could turn on causing the circuit to draw power.

As an example of the operation of level shift circuit 6, assume that the output is initially low and the input is traversing from a low level to a high level. As SIGIN rises, N2 begins to turn on. This begins to pull node X1 low, which in turn begins to turn P2 on. At the same time that N2 is turning on, P3 is beginning to turn off and N3 is beginning to turn on, lowering the voltage at node X2. As the voltage at node X2 begins to fall, N4 begins to turn off, decoupling the output from ground.

As N2 turns on and pulls node X1 low, SIGOUT will begin to rise as P2 turns on. P1 is preferably a weak transistor so that it will not "fight" with N2, which N2 is pulling low and will isolate node X1 from V2 as SIGOUT is rising. SIGOUT will rise to about V2 through P2. For example, W/L for P1 may be about 2/6 in one embodiment.

In a high-to-low transition, N2 begins to turn off, isolating X1 from ground. Also, X2 begins to rise via inverter 12, turning on N4 and pulling SIGOUT to ground. X1 will begin to rise as P1 turns on with a falling SIGOUT, and SIGOUT is also coupled to ground, therefore, via N1 as X1 rises.

Figure 3A:
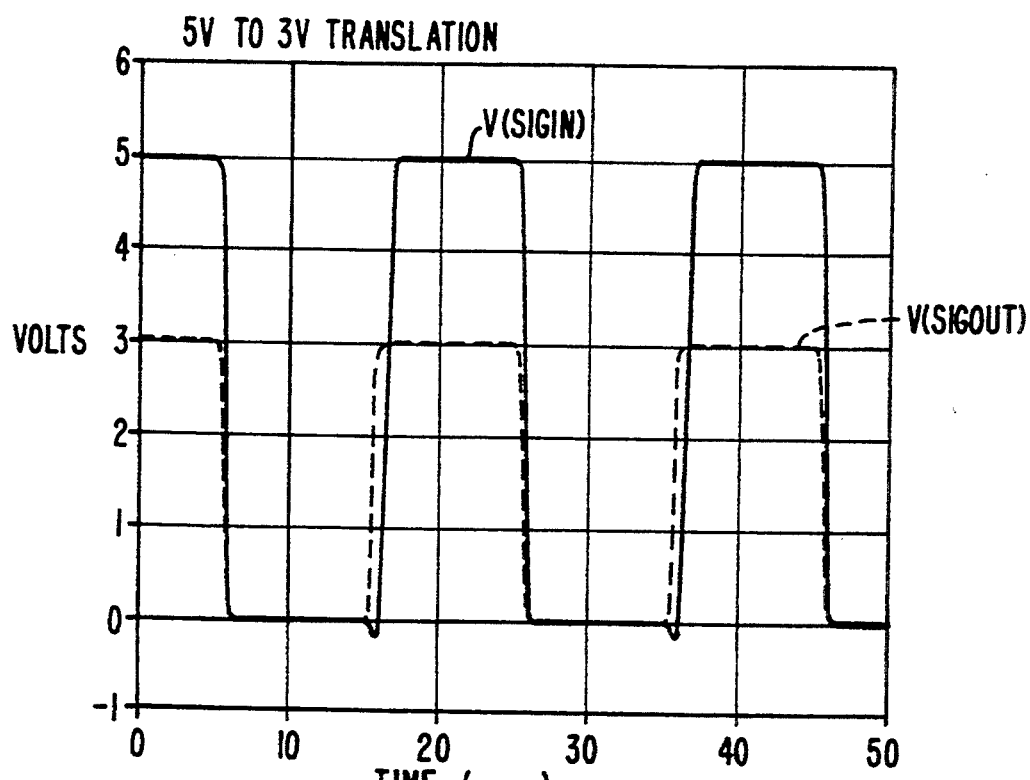
FIG. 3A is a simulation of the voltage level translator performing 5 v to 3 v translation.
Figure 3B:
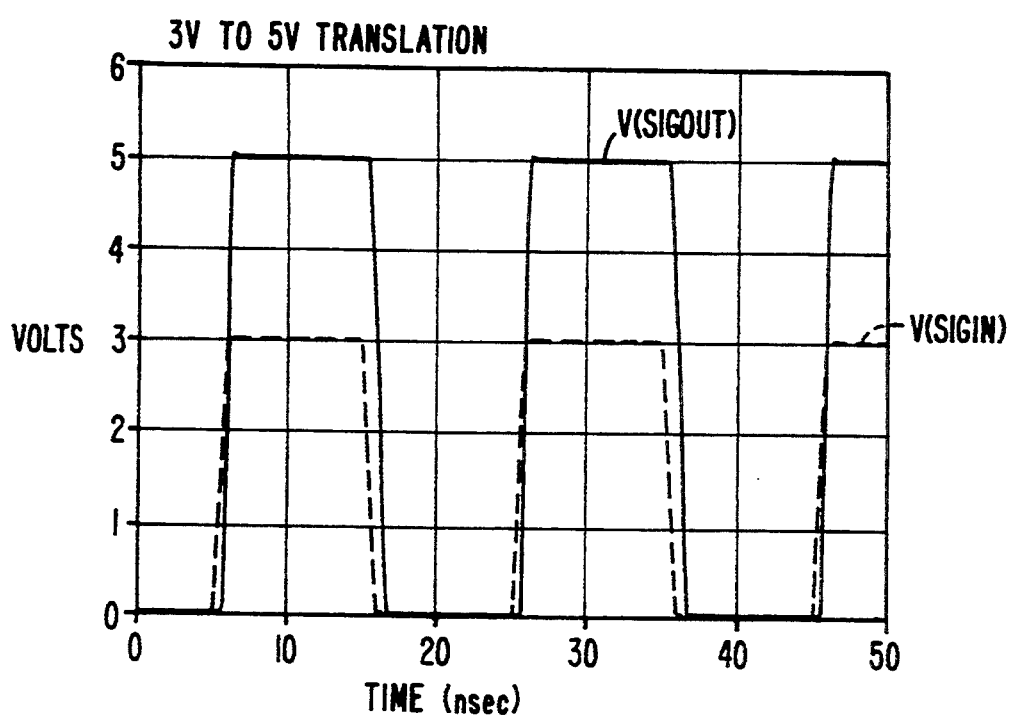
FIG. 3B is a simulation of the voltage level translator performing 3 v to 5 v translation.

FIG. 3A illustrates simulated SIGOUT and SIGIN signals (both low-to-high and high-to-low transitions) for the voltage level translator for a 5 v to 3 v translation. As shown, SIGOUT tracks SIGIN closely. FIG. 3B provides a similar plot for 3 v to 5 v translation with similar results.

The above description is illustrative and not restrictive. Many variations of the invention will become apparent to those of skill in the art upon review of this disclosure. Merely by way of example specific transistor types and sizes have been shown for the purposes of illustration, and particular applications have been illustrated, but the invention is not so limited. The scope of the invention should, therefore, be determined not with reference to the above description, but instead should be determined with reference to the appended claims along with their full scope of equivalents.

What is claimed is:
1. A reprogrammable logic device comprising:
   a reprogrammable logic circuit, said reprogrammable logic circuit having a plurality of inputs and a logic output, said logic output being a combinatorial function of said inputs, said logic output varying between about ground and a first higher voltage level;
   a voltage level translator coupled to said logic output, said voltage level translator comprising:
      a first NMOS transistor having its gate coupled to said logic output, a source coupled to ground, and a drain coupled to a first node;
      a first CMOS inverter having an input coupled to said logic output, output of said first CMOS inverter coupled to a gate of a NMOS pulldown transistor, said NMOS pulldown transistor having a source coupled to ground and a drain coupled to an output of said voltage level translator;
      a first PMOS transistor having a drain coupled to said first node, a source coupled to a voltage source having a second lower voltage level, and a gate coupled to said output of said voltage level translator; and
      a second CMOS inverter having an input coupled to said first node and an output coupled to said output of said voltage level translator; and
   an output buffer having an input coupled to said output of said voltage level translator, and an output coupled to an output pin of said reprogrammable logic circuit.

2. The reprogrammable logic device of claim 1 wherein said first NMOS transistor is larger than said first PMOS transistor.

3. A reprogrammable logic device comprising:
   a reprogrammable logic circuit, said reprogrammable logic circuit having a plurality of inputs and a logic output, said logic output being a combinatorial function of said inputs, said logic output varying between about ground and a first higher voltage level;
a voltage level translator coupled to said logic output, said voltage level translator consisting of:
  a first NMOS transistor having its gate coupled to said logic output, a source coupled to ground, and a drain coupled to a first node;
  a first CMOS inverter having an input coupled to said logic output, output of said first CMOS inverter coupled to a gate of a NMOS pulldown transistor, said NMOS pulldown transistor having a source coupled to ground and a drain coupled to an output of said voltage level translator;
  a first PMOS transistor having a drain coupled to said first node, a source coupled to a voltage source having a second lower voltage level, and a gate coupled to said output of said voltage level translator; and
  a second CMOS inverter having an input coupled to said first node and an output coupled to said output of said voltage level translator; and
an output buffer having an input coupled to said output of said voltage level translator, and an output coupled to an output pin of said reprogrammable logic circuit.

4. The reprogrammable logic device of claim 3 wherein said first NMOS transistor is larger than said first PMOS transistor.

* * * * *